United States Patent [19]

Chen et al.

[11] Patent Number: 5,748,524
[45] Date of Patent: May 5, 1998

[54] MRAM WITH PINNED ENDS

[75] Inventors: Eugene Chen, Gilbert; Saied N. Tehrani, Tempe; Ronald N. Legge, Scottsdale; Xiaodong T. Zhu, Chandler, all of Ariz.

[73] Assignee: Motorola, Inc., Schaumburg, Ill.

[21] Appl. No.: 701,355

[22] Filed: Sep. 23, 1996

[51] Int. Cl.⁶ .................................... G11C 11/15
[52] U.S. Cl. ...................... 365/173; 365/171; 365/158
[58] Field of Search .......................... 365/173, 158, 365/171, 74, 66, 63

[56] References Cited

U.S. PATENT DOCUMENTS 3,479,156  11/1969  Ginder .......................... 365/173
3,553,660  1/1971  Wolf ............................. 365/173

Primary Examiner—Joseph A. Popek
Assistant Examiner—Hoai V. Ho
Attorney, Agent, or Firm—Eugene A. Parsons

[57] ABSTRACT

A multi-layer magnetic memory cell is provided, with magnetic end vectors adjacent the ends of the cell pinned in a fixed direction. To pin the magnetic end vectors, a magnetic field is applied to an end of at least one of the layers of magnetic material in the cell to move the magnetic end vectors in the magnetic material at the end of the cell into a fixed direction. Pinning material is then disposed adjacent to the end to maintain the magnetic end vectors in the magnetic material at the end of the cell in the fixed direction.

16 Claims, 2 Drawing Sheets

MRAM WITH PINNED ENDS

FIELD OF THE INVENTION

The present invention pertains to magnetic layers of material and more specifically to magnetic layers of material in multi-layer magnetic memory cells.

BACKGROUND OF THE INVENTION

One type of magnetic memory cell uses multi-layer giant magnetoresistive materials (GMR) and utilizes submicron widths, in order to increase density. A conductive layer is disposed between the multi-layers of giant magnetoresistive material. In this structure the magnetization vectors are parallel to the length of the magnetic material instead of the width. In one embodiment the magnetization vector of one magnetic material layer is always maintained in one direction while the magnetization vector of the second magnetic layer switches between parallel and antiparallel to the first vector in order to represent both logical "0" and "1" states. In order to determine the logical state of a memory cell utilizing this material, the memory cell has a reference cell and an active cell. The reference cell always provides a voltage corresponding to one state (either always a "1" or always a "0"). The output of the reference cell is compared to the output of the active cell in order to determine the state of the memory cell. The requirement for an active and a reference cell reduces the density of a memory that utilizes such elements. Additionally, each memory cell requires transistors to switch the active and reference cells at appropriate times in order to read the cells. This further increases the cost of the memory.

In a non-volatile memory another magnetic memory cell is used which basically includes a finite dimension element of a giant magnetoresistive (GMR) material, a sense line, and a word line. The MRAM employs the GMR effect for memory operations. Magnetic vectors in one or all of the layers of GMR material are switched very quickly from one direction to an opposite direction when a magnetic field is applied to the GMR material over a certain threshold. According to the direction of the magnetic vectors in the GMR material, states are stored, for example, one direction can be defined as a logic "0", and another direction can be defined as a logic "1". The GMR material maintains these states even without a magnetic field being applied. In this type of device a sense current is passed through the cell along the longitudinal axis to read the stored state.

However, because ends of the layers of magnetic material form a discontinuity in magnetization distribution, very high fields and magnetic poles are formed at the discontinuity or ends of the layers. These high fields force magnetic vectors adjacent the ends to align approximately parallel to the discontinuities or ends. These end effects cause the resistance and switching characteristics of the cell to vary in accordance with the detailed distribution of the magnetic vectors adjacent the ends. This variation in resistance and switching characteristics can be sufficient to cause problems in the reading or sensing of stored states in the cell.

Accordingly, it is highly desirable to provide layers of magnetic material with non-varying magnetic end vectors and memory cells which utilize these layers.

It is a purpose of the present invention to provide new and improved layers of magnetic material for use in multi-state, multi-layer magnetic memory cell.

It is another purpose of the present invention to provide a new and improved multi-state, multi-layer magnetic memory cell with repeatable switching behavior.

It is a further purpose of the present invention to provide a new and improved multi-state, multi-layer magnetic memory cell which can be switched in the various states with a repeatable magnetic field.

It is a still further purpose of the present invention to provide a new and improved multi-state, multi-layer magnetic memory cell with a repeatable resistance in the various states.

It is yet another purpose of the present invention to provide a new and improved multi-state, multi-layer magnetic memory cell with a lower operating power.

SUMMARY OF THE INVENTION

The above problems and others are at least partially solved and the above purposes and others are realized in a magnetic memory cell including a layer of magnetic material having a width and a length, and means positioned adjacent to at least one end of the layer of magnetic material to pin magnetic end vectors in magnetic material at the one end in a fixed direction.

A preferred process for pinning magnetic end vectors adjacent the end of the layer of magnetic material includes the steps of providing a layer of magnetic material having a width less than a width of magnetic domain walls within the layer of magnetic material so as to restrict major magnetic vectors in the layer of magnetic material to point substantially along the length of the layer of magnetic material. Generally, the layer of magnetic material is at least one layer in a multi-layer magnetic memory cell. A magnetic field is applied to at least one end of the layer of magnetic material to move magnetic end vectors in the magnetic material at the end into a fixed direction and pinning material is disposed adjacent to the end to maintain the magnetic end vectors in the magnetic material at the end in the fixed direction.

BRIEF DESCRIPTION OF THE DRAWINGS

Referring to the drawings.

DESCRIPTION OF THE PREFERRED EMBODIMENTS

Figure 1:
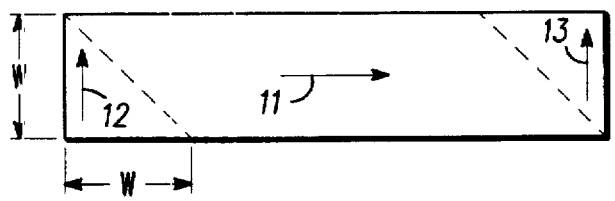
FIGS. 1 through 4 are views in top plan of a layer of magnetic material illustrating various possible magnetic end vector orientations.

Turning now to the drawings, FIGS. 1 through 4 are views in top plan of a layer 10 of magnetic material, illustrating various possible magnetic vector orientations. Referring specifically to FIG. 1, layer 10 has a width "W" less than a width of magnetic domain walls within the layer of magnetic material so as to restrict magnetic vector 11 in layer 10 to point substantially along the length of layer 10 of magnetic material. Magnetic vector 11 represents the major portion of the magnetic domain or domains in layer 10. However, because the ends of layer 10 form a discontinuity in the magnetic domains, very high fields and magnetic poles are formed at the discontinuity or ends of the layers. Discontinuities are not present along the sides of layer 10 since magnetic vector 11 is substantially parallel to the sides. The high fields at the ends of layer 10 cause magnetic vectors adjacent the ends, which are defined as minor magnetic end vectors, and which attempt to form a closed magnetic loop at the ends. While these minor magnetic end vectors are illustrated herein as a single magnetic end vector 12 at the left end and a single magnetic end vector 13 at the right end, for simplicity, it should be understood that each is composed of one or more smaller magnetic end vectors pointing in different directions. Also, for purposes of this disclosure the term "ends" will generally be defined to mean an area the width W of layer 10 and with a length equal to or less than the distance "W" (the width of layer 10) from the physical end, as illustrated in FIG. 1.

Figure 2:
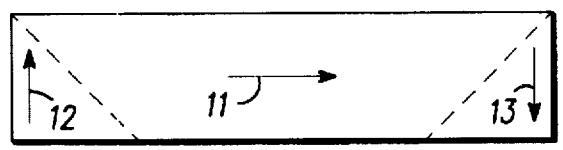
Figure 3:
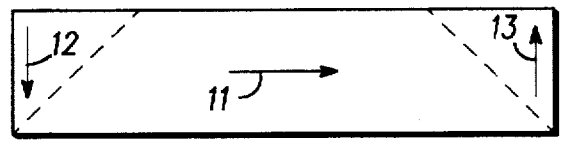
Figure 4:
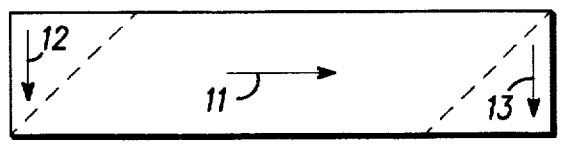

The problem that minor magnetic end vectors 12 and 13 present is that they are haphazardly positioned, generally approximately parallel to the discontinuities or ends of layer 10. For example: as seen in FIG. 1, both magnetic end vectors 12 and 13 are oriented upwardly; as seen in FIG. 2, end vector 12 is oriented upwardly while end vector 13 is oriented downwardly; as seen in FIG. 3, end vector 12 is oriented downwardly while end vector 13 is oriented upwardly; and as seen in FIG. 4, both end vectors 12 and 13 are oriented downwardly. In reality, since each of end vectors 12 and 13 may represent several minor magnetic end vectors, there may be a great many more possible orientations.

Each time magnetic vector 11 is switched, magnetic end vectors 12 and 13 can change position, or not, depending upon the magnetic field applied, the material, the previous position, etc. The problem is that each of the various possible positions of end vectors 12 and 13 result in changes of the resistance of layer 10, when used in a magnetic memory cell, as well as requiring different switching fields to produce switching in layer 10. That is, since each set of magnetic vectors 11, 12, and 13 require a certain magnitude of magnetic field to switch direction and since either or both of magnetic end vectors 12 and 13 may switch directions with magnetic vector 11, the magnitude of the magnetic field required to switch magnetic vector 11 may vary each time it is switched. The variation in resistance can be sufficient to cause problems in the reading or sensing of stored states in a magnetic memory cell and the variations in magnitude of the magnetic field required to switch states in the cell can cause switching problems, especially in large arrays, and will certainly use additional power, which can become substantial in large arrays.

Figure 5:
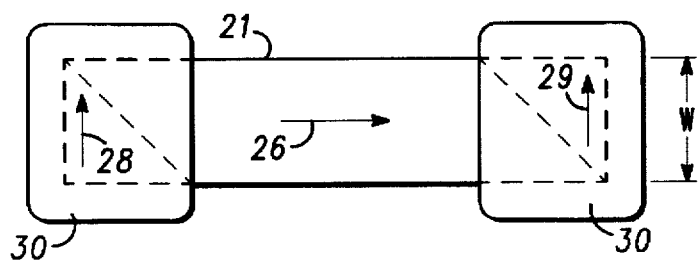
FIG. 5 is a view in top plan of a multi-layer magnetic memory cell with pinned end magnetic end vectors.
Figure 6:
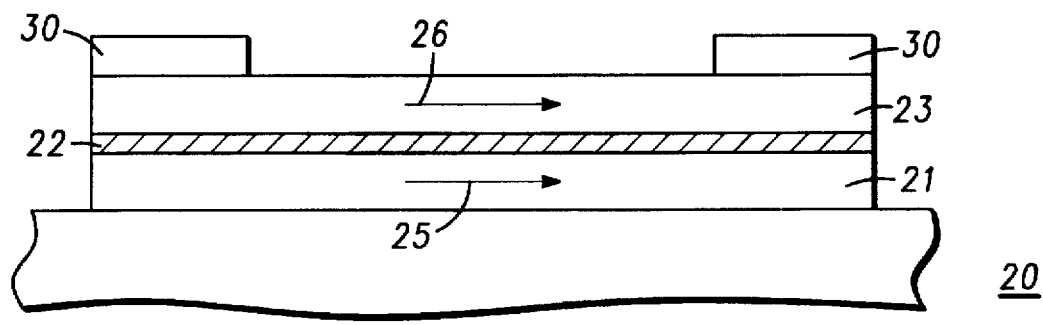
FIG. 6 is a sectional view of the multi-layer magnetic memory cell illustrated in FIG. 5.

Turning now to FIGS. 5 and 6, an enlarged view in top plan and a cross-sectional view, respectively, of a multi-layer magnetic memory material cell 20, having multiple layers of magnetic material that are ferromagnetically coupled, are illustrated. Cell 20 includes a first magnetic layer 21 and a second magnetic layer 23. Layers 21 and 23 are separated by a first conductive spacer layer 22. Magnetic layers 21 and 23 each can be single layers of magnetic materials such as a layer of nickel or iron or cobalt or alloys thereof. Any of layers 21 and 23 alternately can be a composite magnetic layer, such as a layer of nickel-iron-cobalt covering a layer of cobalt-iron. Materials that are suitable for layer 22 includes most conductive materials including copper, copper alloys, chromium, and chromium alloys. Also, although shown having two magnetic layers, cell 20 can have more than two magnetic layers including a third and a fourth magnetic layer that typically are similar to layers 21 and 23, and which are separated by second and third conductive spacer layers similar to layer 22.

In the preferred embodiment, layers 21 and 23 are rectangular and are formed with the easy axis of magnetization along a length and not along a width W of cell 20. In other embodiments, the easy axis can be along width W. Layers 21 and 23 each have major magnetization or magnetic vectors 25 and 26, respectively, that are substantially along the length of cell 20, that is, substantially parallel to the length of each layer 21 and 23. Layers 21 and 23 are coupled by a ferromagnetic coupling which allows magnetic vectors 25 and 26 to align in the same direction (either to the left or to the right in FIG. 6) in the absence of an external magnetic field. This ferromagnetic coupling is a function of the material and the thickness of layer 22.

Additionally width W is formed to be smaller than the width of the magnetic domain walls or transition width within layers 21 and 23. Consequently, magnetic vectors 25 and 26 can not be parallel to width W. Typically, widths of less than 1.0 to 1.2 microns result in such a constraint. In the preferred embodiment, width W is less than one micron and is as small as can be made by manufacturing technology, and the length is approximately five times width W. Generally, the greater the value of the length, the higher the output voltage of cell 10. Also in the preferred embodiment, layer 23 has a thickness that is approximately three to six nanometers and layer 21 has a thickness that is approximately four to ten nanometers. The difference in thicknesses between layers 21 and 23 affect the switching points of layers 21 and 23, providing a sensing or reading capability. In a specific example, layers 21 and 23 each are two layer structures including layers of cobalt-iron and nickel-iron-cobalt so that cobalt-iron is at the interface with conductive layer 22.

In the preferred embodiment illustrated in FIGS. 5 and 6, magnetic end vectors 28 and 29 in opposite ends of cell 20 are pinned in a fixed direction (in this example, both are pointed in the same direction, upwardly in FIG. 5). In this embodiment, the pinning process is accomplished by first applying a magnetic field to the ends of at least layer 23 of cell 20 to move magnetic end vectors 28 and 29 in the magnetic material at the end into a fixed direction. Here it should be understood that magnetic end vectors 28 and 29 can be pinned in virtually any desired direction, as long as they remain in that direction throughout the operation of cell 20. Generally, it is desirable to pin magnetic end vectors 28 and 29 in an orientation substantially perpendicular to the length, or parallel to width W so as to reduce the end effects and at least partially close the magnetic loops. In some embodiments, and/or applications, it may be sufficient to simply pin magnetic end vectors 28 and 29 in whatever orientation they happen to be in at the time of pinning.

In either situation, whenever magnetic end vectors 28 and 29 are in a desired, or fixed, orientation, pinning material 30 is disposed adjacent to each end, to maintain magnetic end vectors 28 and 29 (substantially all magnetic vectors in the end area) in the fixed direction or orientation. Pinning material 30 is positioned adjacent only to the ends, so as not to effect the magnetic material in the major domain or domains between the ends. Generally, pinning material 30 may be deposited and patterned, selectively deposited, etc. by any of the well known semiconductor techniques or by any other convenient techniques. Pinning material 30 is any material which will pin magnetic end vectors 28 and 29 in a fixed orientation and generally includes antiferromagnetic material, such as FeMn, NiMn, IrMn, various alloys of these materials, etc., or hard or permanent magnetic material, such as CoPt, CoPtCr, various alloys of these materials, etc.

In the present example, layers 21 and 23 of cell 20 are coupled so that pinning magnetic end vectors 28 and 29 in layer 23 will automatically pin any end vectors in the ends of layer 21. In other embodiments, it may be desirable to add additional pinning material to layer 21 so as to individually pin magnetic end vectors therein.

Figure 7:
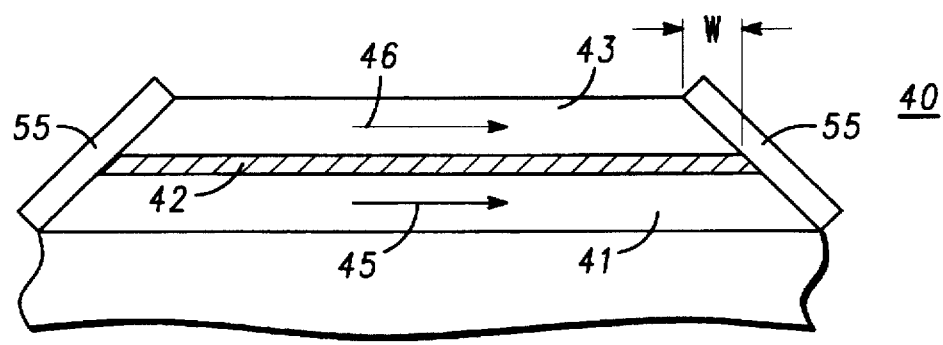
FIG. 7 is a sectional view of another multi-layer magnetic memory cell with different pinning means.
Figure 8:
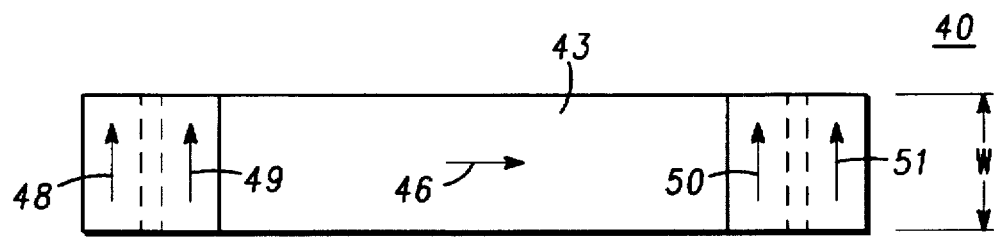
FIG. 8 is a view in top plan of the multi-layer magnetic memory cell illustrated in FIG. 7.

Turning now to FIGS. 7 and 8, a cross-sectional view and an enlarged view in top plan, respectively, of a multi-layer magnetic memory material cell 40, having multiple layers of magnetic material that are ferromagnetically coupled, are illustrated. Cell 40 includes a first magnetic layer 41 and a second magnetic layer 43. Layers 41 and 43 are separated by a first conductive spacer layer 42. As explained in conjunction with FIGS. 5 and 6, magnetic layers 41 and 43 each can be single layers of magnetic materials such as a layer of nickel or iron or cobalt or alloys thereof. Similarly, materials that are suitable for layer 42 includes most conductive materials including copper, copper alloys, chromium, and chromium alloys. Also, although shown having two magnetic layers, cell 40 can have more than two magnetic layers separated by additional conductive spacer layers.

In this embodiment, layers 41 and 43 are rectangular and are formed with the easy axis of magnetization along a length and not along a width W of cell 40. In other embodiments, the easy axis can be along width W. Layers 41 and 43 each have major magnetization or magnetic vectors 45 and 46, respectively, that are substantially along the length of cell 40, that is, substantially parallel to the length of each layer 41 and 43. Layers 41 and 43 are coupled by a ferromagnetic coupling which allows magnetic vectors 45 and 46 to align in the same direction (either to the left or to the right in FIG. 7) in the absence of an external magnetic field. This ferromagnetic coupling is a function of the material and the thickness of layer 42. Additionally width W is formed to be smaller than the width of the magnetic domain walls or transition width within layers 41 and 43. Consequently, magnetic vectors 45 and 46 can not be parallel to width W.

In the specific embodiment illustrated in FIGS. 7 and 8, the ends of cell 40 are removed at an angle to the perpendicular so as to produce a tapered end. Basically, the thickness of layers 41 and 43 is tapered so as to form a surface on which pinning material can be positioned. By removing the entire end of cell 40 in this fashion, each of layers 41 and 42 present an end surface substantially overlying the end area in which magnetic end vectors are formed. In other embodiments, it may be sufficient to simply taper, or remove a portion of, the upper layer (layer 43).

In this example, layers 41 and 43 have magnetic end vectors 48 and 49, respectively, on the left side and magnetic end vectors 50 and 51, respectively, on the right side of cell 40. Magnetic end vectors 48, 49, 50, and 51 are pinned in a fixed direction (in this example, all four are pointed in the same direction, upwardly in FIG. 8). In this embodiment, the pinning process is accomplished by first applying a magnetic field to the ends of cell 40 to move magnetic end vectors 48, 49, 50, and 51 in the magnetic material at the end into the fixed or desired direction. Here again it should be understood that magnetic end vectors 48, 49, 50, and 51 can be pinned in virtually any desired direction, as long as they remain in that direction throughout the operation of cell 40. Generally, it is desirable to pin magnetic end vectors 48, 49, 50, and 51 in an orientation substantially perpendicular to the length, or parallel to width W so as to reduce the end effects. In some embodiments, and/or applications, it may be sufficient to simply pin magnetic end vectors 48, 49, 50, and 51 in whatever orientation they happen to be in at the time of pinning.

In either situation, whenever magnetic end vectors 48, 49, 50, and 51 are in the desired, or fixed, orientation, pinning material 55 is disposed on the surface produced by the removal of material adjacent to each end, to maintain magnetic end vectors 48, 49, 50, and 51 (substantially all magnetic vectors in the end area) in the fixed direction or orientation. Again, pinning material 55 is any material which will pin magnetic end vectors 48, 49, 50, and 51 in a fixed orientation and generally includes antiferromagnetic material, such as FeMn, NiMn, IrMn, various alloys of these materials, etc., or hard or permanent magnetic material, such as CoPt, CoPtCr, various alloys of these materials, etc.

Thus, a new and improved multi-state, multi-layer magnetic memory cell is disclosed which includes layers of magnetic material with more reproducible switching characteristics. The new and improved multi-state, multi-layer magnetic memory cell is constructed so that it can be switched in the various states with a repeatable magnetic field and so that it has a repeatable resistance in the various states. Also, because magnetic end vectors in the new and improved multi-state, multi-layer magnetic memory cell are fixed and power is not required to switch the magnetic end vectors along with the major magnetic vectors, the new cell requires less operating power.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. In a magnetic memory cell a layer of magnetic material having a width and a length so as to define opposed ends generally parallel to the width adjacent opposed extremities of the length and means positioned adjacent to at least one of the ends of the layer of magnetic material to pin magnetic end vectors in the magnetic material at the one end in a fixed direction.

2. In a magnetic memory cell a layer of magnetic material as claimed in claim 1 wherein the means positioned adjacent to the at least one end includes a layer of antiferromagnetic material.

3. In a magnetic memory cell a layer of magnetic material as claimed in claim 1 wherein the means positioned adjacent to the at least one end includes a layer of hard or permanent magnetic material.

4. In a magnetic memory cell a layer of magnetic material as claimed in claim 1 wherein the layer of magnetic material includes a thickness that is tapered at the at least one end to form a surface and the means is positioned on the surface at the at least one end.

5. In a magnetic memory cell a layer of magnetic material as claimed in claim 1 wherein the layer of magnetic material has a width less than a width of magnetic domain walls within the layer of magnetic material so as to restrict major magnetic vectors in the layer of magnetic material to point substantially along the length of the layer of magnetic material.

6. A multi-layer, magnetic memory cell comprising:
   a first layer of magnetic material;
   a layer of nonmagnetic material positioned on the first layer of magnetic material;
   a second layer of magnetic material positioned on the layer of nonmagnetic material so as to form a magnetic memory cell;
   the magnetic memory cell having a width and a length so as to define opposed ends generally parallel to the width adjacent opposed extremities of the length, with the width being less than a width of magnetic domain walls within the layers of magnetic material so as to restrict major magnetic vectors in the layers of magnetic material to point substantially along the length of the layers of magnetic material; and means positioned adjacent to at least one of the ends of the magnetic memory cell to pin magnetic end vectors in the magnetic material at the one end in a fixed direction.

7. A multi-layer, magnetic memory cell as claimed in claim 6 wherein the means positioned adjacent to the at least one end of the magnetic memory includes pinning material positioned on one of the first and second layers of magnetic material adjacent the end to maintain the magnetic end vectors in the magnetic material at the end in the fixed direction.

8. A multi-layer, magnetic memory cell as claimed in claim 7 wherein the means positioned adjacent to the at least one end includes a layer of antiferromagnetic material.

9. A multi-layer, magnetic memory cell as claimed in claim 7 wherein the means positioned adjacent to the at least one end includes a layer of hard or permanent magnetic material.

10. A multi-layer, magnetic memory cell as claimed in claim 7 wherein the magnetic memory cell includes a thickness that is tapered at the at least one end to form a surface and the means is positioned on the surface at the at least one end.

11. A multi-layer, magnetic memory cell as claimed in claim 7 wherein the layer of nonmagnetic material includes a layer of electrically conductive material and the first and second layers of magnetic material are ferromagnetically coupled.

12. A process for pinning magnetic vectors adjacent an end of a layer of magnetic material having a width and a length, comprising the steps of:

providing a layer of magnetic material having a width and a length so as to define opposed ends generally parallel to the width adjacent opposed extremities of the length, the width of the layer of magnetic material being less than a width of magnetic domain walls within the layer of magnetic material so as to restrict major magnetic vectors in the layer of magnetic material to point substantially along the length of the layer of magnetic material;

applying a magnetic field to one of the ends of the layer of magnetic material to move magnetic end vectors in the magnetic material at the one end into a fixed direction; and disposing pinning material adjacent the one end to maintain the magnetic end vectors in the magnetic material at the one end in the fixed direction.

13. A process for pinning magnetic vectors adjacent the end of a layer of magnetic material as claimed in claim 12 wherein the step of disposing pinning material adjacent the end includes disposing a layer of antiferromagnetic material adjacent the end.

14. A process for pinning magnetic vectors adjacent the end of a layer of magnetic material as claimed in claim 12 wherein the step of disposing pinning material adjacent the end includes disposing a layer of hard or permanent magnetic material adjacent the end.

15. A process for pinning magnetic vectors adjacent the end of a layer of magnetic material as claimed in claim 12 wherein the step of disposing pinning material adjacent the end includes tapering the at least one end to form a surface and positioning the pinning material on the surface at the at least one end.

16. A process for pinning magnetic vectors adjacent the end of a layer of magnetic material as claimed in claim 12 wherein the step of providing a layer of magnetic material includes disposing the layer of magnetic material in a multi-layer magnetic memory cell.

* * * * *